United States Patent [19]

Hegendörfer

[11] 4,042,842

[45] Aug. 16, 1977

[54] MULTIPLE-TIME-CONSTANT INTEGRATOR OR DIFFERENTIATOR

[75] Inventor: Max Hegendörfer, Forchheim, Germany

[73] Assignee: GRUNDIG E.M.V. Elektro-Mechanische Versuchsanstalt Max Grundig, Furth, Bayern, Germany

[21] Appl. No.: 530,343

[22] Filed: Dec. 6, 1974

[30] Foreign Application Priority Data

Dec. 15, 1973 Germany ............................ 2362414

[51] Int. Cl.[2] ........................ H03K 5/13; H03K 17/60

[52] U.S. Cl. .................................... 307/293; 307/229; 307/260; 307/265; 307/255; 328/127

[58] Field of Search ............... 307/229, 228, 293, 273, 307/260, 265, 255; 84/1.13; 328/127, 58

[56] References Cited

U.S. PATENT DOCUMENTS

| | | | |
|---|---|---|---|
| 3,665,091 | 5/1972 | Hirano | 84/1.13 |
| 3,703,649 | 11/1972 | Maida | 328/127 |
| 3,875,428 | 4/1975 | Le Blanc et al. | 328/127 |
| 3,924,505 | 12/1975 | Schrecongost | 84/1.13 |

*Primary Examiner*—Stanley D. Miller, Jr.
*Attorney, Agent, or Firm*—Michael J. Striker

[57] ABSTRACT

A first pulse generator supplies an RC circuit including a first and second resistance and a capacitance. The voltage across the capacitance constitutes the output voltage. To decrease the time constant, a second pulse generator identical to the first is switched in between reference potential and the common point of the two resistors. The first pulse generator includes a first and second transistor connected in series between a first and second reference potential and a logic circuit which alternately drives the transistors to the conductive state thereby alternately connecting the common point of the two transistors to the first and second reference potential. The second pulse generator is identical to the first except that the logic circuit driving the two transistors also includes a state wherein both transistors are blocked causing the common point of the two transistors which is also the common point of the two resistances to be disconnected from both reference potentials.

6 Claims, 5 Drawing Figures

MULTIPLE-TIME-CONSTANT INTEGRATOR OR DIFFERENTIATOR

BACKGROUND OF THE INVENTION

This invention relates to a circuit operative at a first or second time constant. Particularly, it relates to such circuits which utilize RC circuits fed by a pulse generator G. Such circuits are common in dynamic digital/analog converters.

In such dynamic digital/analog converters, the analog value is generally derived by integration from a pulse sequence. For this purpose an integrating circuit having a time constant $p$ is generally utilized. These integrating circuits also go under the name of lowpass filter. This type of circuit, namely a series circuit of a resistor and a capacitor, takes the form of an unsymmetrical four-pole integrator whose input is alternately connected to a first and second reference potential by means of the pulse generator. The output voltage $U_A$ of the four-pole network, which constitutes the output analog signal, is of course derived from the capacitor. A long time constant, as is well known, causes little ripple to appear on the output signal which is extremely desirable. However it has the disadvantage that the circuit introduces delay. Therefore if a rapid change between different analog values and a low ripple are to be realized, the time constant must be changed. The analog value is changed at a low time constant and the circuit is then switched to a higher time constant. Two basic possibilities have been realized heretofore for switching the time constant of RC circuits (which RC circuits are to include differentiating circuits as well as the above-described integrator circuit): switching of the value of the capacitor C or that of the resistor R. Either parallel or series circuits may be used to implement the switching.

The disadvantages of the above two methods of switching the time constant will be explained with reference to an integrating circuit even though the same considerations are valid for a differentiating circuit.

First prior-art circuit is shown in FIG. 1. It constitutes a series resistor R, a first capacitor C across which the output voltage $U_A$ is to be furnished, and a capacitor C' which may be connected in parallel with a capacitor C by closing of a switch. However, if an additional capacitor having an arbitrary initial charge is abruptly connected in parallel with capacitor C, the transient arising due to the exchange of charge between the two capacitors upon closing of the switch causes a large error to be introduced into the output voltage. This condition cannot be tolerated in most applications.

In accordance with the method of FIG. 2, an additional resistance R' is alternately connected in series with the main resistor R or is short-circuited. Here the difficulty exists that both sides of switch S are at varying potentials.

SUMMARY OF THE INVENTION

It is an object of the present invention to furnish a circuit readily switchable from a first to a second time constant. In particular it is an object of the present invention to overcome the above-mentioned disadvantages and to furnish a rapidly acting digital/analog converter whose output still carries little ripple. The present invention is a circuit selectively operable at a first or second time constant to furnish an output voltage in response to an input signal. It comprises a first signal generator for furnishing said input signal. It further comprises an RC circuit including a first impedance connected to said signal generator, a second impedance connected to said first impedance at a common point and a third impedance connected to said second impedance, the voltage across said third impedance constituting said output voltage. Further comprised is a series circuit connected from a reference potential to the common point of the first and second impedance, said series circuit including a second signal generator substantially identical to the first signal generator and a switch for connecting said series circuit from said common point to a reference potential when closed.

In a preferred embodiment of the present invention the first signal generator is a pulse generator including a first and second transistor connected in series between a first and second reference potential, and logic circuits for alternately switching said first and second transistor to the conductive state so that the common point of the two transistors is alternately connected to the first and second reference potential. The first impedance has one terminal connected to the common point of the two transistors and the second point namely the common point with the second impedance, connected to a similar common point of a third and fourth transistor constituting the second pulse generator. The logic circuitry for the second pulse generator differs from that of the first in that a third state is provided wherein both transistors are blocked, causing the common point of the two impedances to be disconnected from both reference potentials.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

A preferred embodiment of the present invention will now be described with reference to the drawings.

Figure 1:
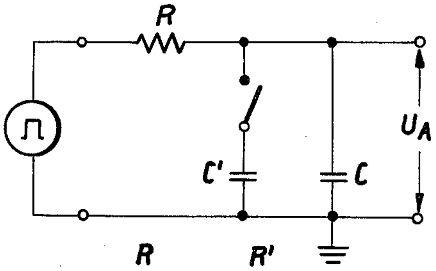
Fig. 1 PRIOR ART
FIG. 1 is a circuit diagram of a prior-art circuit selectively operable at a first or second time constant.
Figure 2:
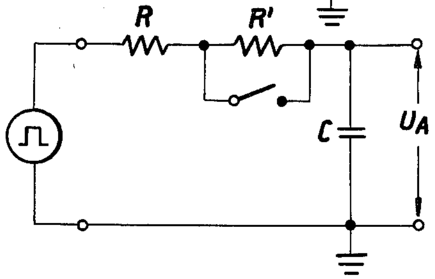
Fig. 2 PRIOR ART
FIG. 2 is an alternate embodiment of the prior-art circuit.

FIGS. 1 and 2 show the present state of the art which has been described under the background of the invention.

Figure 3:
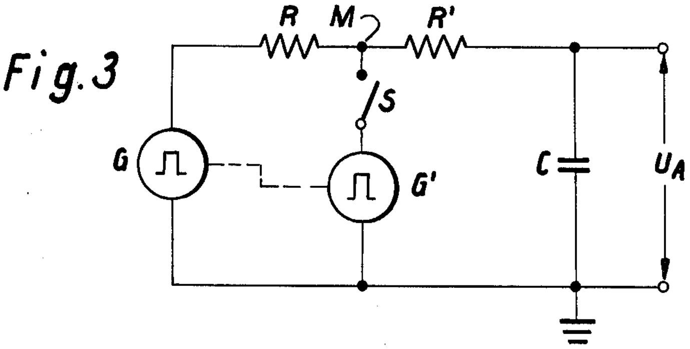
FIG. 3 is a generalized diagram of the circuit in accordance with the present invention.

FIG. 3 is a generalized circuit diagram of the present invention showing the basic idea thereof. In particular it shows the present invention as embodied in an integrator circuit. It should of course be noted that the present invention is in no way limited to integrator circuits only. In particular in FIG. 3 a pulse generator G whose pulse sequence is to be converted to an analog voltage appearing across a capacitor C, feeds an RC network including the above-mentioned capacitor C and a first impedance, here a resistance R connected to the generator G and a second impedance, here a resistance R' connected between resistor R and capacitor C. The common point of resistors R and R' is denoted by M. A series circuit including a pulse generator G', substantially identical to pulse generator G and a switch S is connected from ground potential (one embodiment of a reference potential) to point M. Pulse generators G and G' as will be shown below may be embodied in digital switches operated in synchronism. As will be shown in greater detail with reference to FIG. 4, the output voltage at the top terminal of generator G', namely the terminal connected to switch S, can assume either ground potential, a high potential or, can be disconnected from point M by opening of switch S. The operation of pulse generator G' is thus a so-called "tristate" operation.

Figure 4:
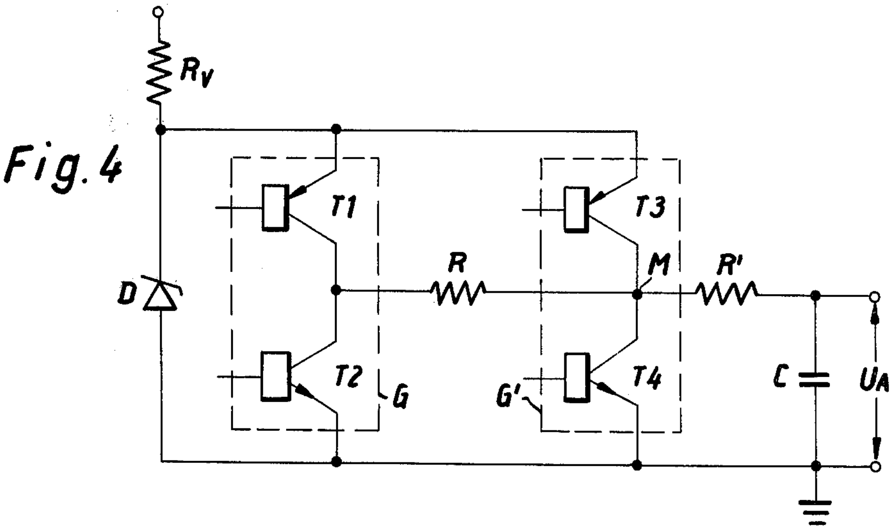
FIG. 4 is a circuit diagram of the present invention showing the first and second pulse generator in greater detail.

FIG. 4 shows a preferred embodiment of pulse generators G and G' as connected into the circuit of FIG. 3. The first reference potential referred to herein is ground potential, the second reference potential being supplied by means of resistor $R_V$ which has one terminal connected to B+ and is connected in series with a Zener diode D whose other terminal is connected to ground potential. Th eemitter-collector circuit of a transistor T1 is connected in series with the emitter-collector circuit of transistor T2, the so-formed series circuit being connected from the common point of resistor $R_V$ and Zener diode D (second reference potential) to ground potential. Transistors T1 and T2 are of opposite conductivity type. Similarly the emitter-collector circuit of a transistor T3 is connected to the second reference potential and its other terminal is connected through the emitter-collector circuit of a transistor T4 to ground potential. The common point of transistors T3 and T4 constitutes point M. Resistor R is connected from the common point of transistors T1 and T2 to the common point M. Transistor T3 is of the same conductivity type (pnp) as transistor T1 and transistor T4 is of the same conductivity type (npn) as transistor T2. From point M to ground potential is, of course, connected the series combination of resistor R' and capacitor C. As mentioned above the voltage across capacitor C, $U_A$, constitutes the output voltage.

If the time constant of the circuit is to be a short time constant transistors T3 and T1 are operated in synchronism as are transistors T4 and T2. If, for example, transistors T1 and T3 are switched to the fully conductive state, point M is substantially at the second reference potential. When transistors T4 and T2 are made fully conductive, point M is at ground potential. Point M thus switches between a second reference potential and ground potential. The effective time constant of the circuit varies as a function of R' and C.

When a higher time constant, that is a lower ripple, is desired, the logic circuit operating transistors T3 and T4 is switched to a state wherein both transistors are blocked. The common point of transistors T1 and T2 is then switched alternately between the second reference potential and ground potential, the effective time constant of the circuit now varying as a function of R+R' and C. It will be noted that the change in time constant which is accomplished by the control of transistors T3 and T4 takes place without any transient effect at the output of the circuit.

Figure 5:
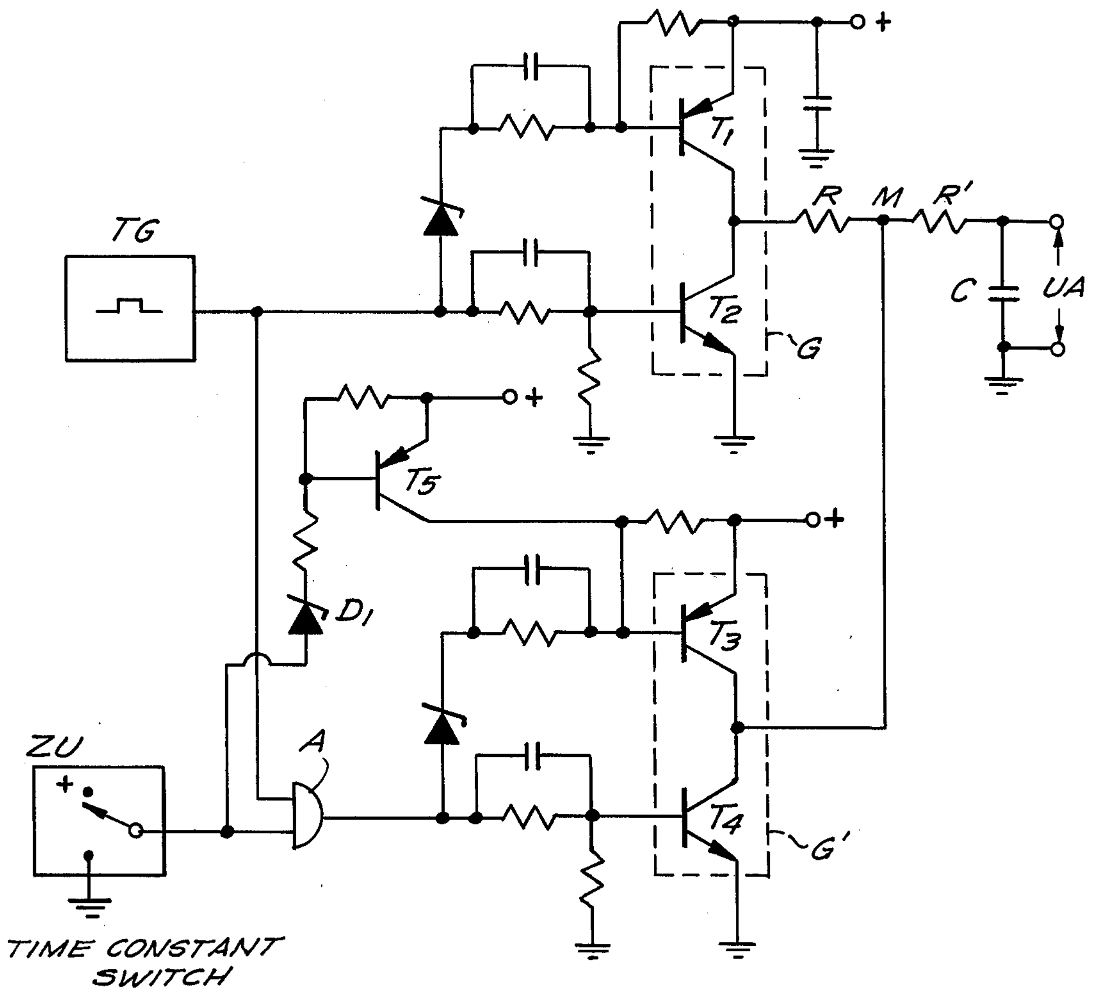
FIG. 5 is a schematic diagram of the overall circuit of the present invention.

The logic circuit controlling transistors T1 and T2 and transistors T3 and T4 will now be described in more detail with reference to FIG. 5. Transistors T1, T2, T3, T4, resistors R and R' and capacitor C is shown in FIG. 5 as they were in FIG. 4. The terminal furnishing the second reference potential, labelled + in FIG. 5, corresponds to the common point between resistor $R_V$ and Zener diode D in FIG. 4. A digital signal having a logic high and a logic low level is applied by a pulse generator TG. This signal is to serve to control transistors T1 and T2 as well as transistors T3 and T4 in such a manner that the common point of each pair of transistors is alternately switched from the positive (second) reference potential to ground potential. The switching is to take place with steep leading and trailing edges and at a low impedance so that the voltage across capacitor C varies directly as the pulse width of the pulses furnished by pulse generator TG.

If the above integration is not carried out with very little ripple, the very high accuracy of the digital signal becomes useless. In particular if the ripple exceeds the quantization achieved by the digital signal, the analog signal will not have the accuracy required of the digital signal. On the other hand it is of course also desirable to introduce little delay or inertia into the system which results in the requirement for a relatively short time constant. The circuit of FIG. 5 allows the selection of the higher time constant (G' inoperative) by switching time constant switch $Z_U$ to ground potential and the selection of a short time constant by switching switch $Z_U$ to positive potential.

To explain this in more detail, the action of transistors T1 and T2 will first be considered in response to the input signals furnished by generator TG. When a pulse is present, that is when the terminal connected to generator TG is at a high potential, transistor T2 is conductive, while transistor T1 is blocked. The left-hand terminal of resistor R is therefore connected to ground potential. When the signal furnished by TG is at ground potential, that is in the absence of a pulse, transistor T2 is blocked and transistor T1 becomes conductive. Under these conditions, the left-hand terminal of resistor R is connected to the positive potential. It will be seen that the left-hand terminal of resistor R thus effectively changes from a low to a high potential under control of the applied pulses.

When switch $Z_U$ is connected to positive potential, one input of AND-gate A is energized. Therefore the output of AND-gate A would be identical to the signal furnished by generator TG. Transistors T3 and T4 therefore serve to connect point M alternately to the positive (second) reference potential and ground potential. The output of generator G' thus is either at positive or at ground potential which constitutes a bistable state operation. However, as previously mentioned, in order to achieve a higher time constant, both transistors T3 and T4 must be blocked simultaneously. To achieve this condition, time constant switch $Z_U$ is switched to ground potential causing AND-gate A to be blocked. Transistor T4 is thus blocked. It is now necessary to make certain that transistor T3 is also blocked. Application of the ground potential by time constant switch $Z_U$ to the anode of Zener diode $D_1$ allows emitter-base current to flow in transistor T5 which constitutes an auxiliary transistor and thus cause this transistor to become conductive. When transistor T5 becomes conductive the emitter-base circuit of transistor T3 is short-circuited thereby causing transistor T3 to become nonconductive. Transistors T3 and T4 are thus blocked simultaneously, causing the circuit to operate at a time constant corresponding to the sum of R+R'. The output of generator G' thus undergoes a so-called tristate operation in that it is either directly connected to the positive potential, directly connected to ground potential, or separated by a very high impedance from both of these potentials.

While the invention has been illustrated and described as embodied in particular pulse generator and logic circuits, it is not intended to be limited to the details shown, since various modifications and circuit changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A multiple-time-constant time-constant circuit, comprising, in combination, a first, a second and a third time-constant-determining impedance, at least one of the impedances including at least one energy-storing circuit element, the first, second and third impedances being connected in series, one end of the third impedance constititing one end of the series-connected impedances and being connected to a first reference potential; first and second signal-generating means each having an output respectively connected to one and the other end of the first impedance and operative for producing at their outputs voltages varying substantially identically between the first reference potential and a different second reference potential; the time-constant-selecting means connected to said first and second signal-generating means and operable for selecting a shorter time constant by causing both signal-generating means to operate in unison and alternatively operable for selecting a longer time constant by effectively disconnecting the second signal-generating means and causing the first signal-generating means to operate alone.

2. The circuit defined in claim 1, the first and second signal-generating means being first and second pulse-generating means operative for producing at their outputs voltages alternating in value between the first and the second reference potential, that at least one energy-storing element being a capacitor.

3. The circuit defined in claim 2, the first impedance being a resistor, the second impedance being a resistor, and the third impedance being a capacitor.

4. The circuit defined in claim 1, the circuit being a multiple-time-constant integrator.

5. The circuit defined in claim 1, the first signal-generating means being comprised of a first and a second electronic switch, the second signal-generating means being comprised of a third and a fourth electronic switch, each electronic switch having output electrodes defining respective first, second, third and fourth switch current paths, each electronic switch having a respective control electrode for controlling the conductivity of the respective switch current path, the first switch current path being connected between said one end of the first impedance and the second reference potential, the second switch current path being connected between said one end of the first impedance and the first reference potential, the third switch current path being connected between said other end of the first impedance and the second reference potential, the fourth switch current path being connected between said other end of the first impedance and the first reference potential, the time-constant-selecting means comprising means connected to the control electrodes of the electronic switches and operable for selecting the shorter time constant by causing the first and third switch current paths to become conductive in alternation with the second and fourth switch current paths and alternatively operable for selecting the longer time constant by causing the third and fourth switch current paths to remain non-conductive while causing the first and second switch current paths to become conductive in alternation.

6. The circuit defined in claim 5, wherein said electronic switches are each transistors, the switch current paths of the electronic switches being the collector-emitter paths thereof, the control electrodes of the electronic switches being the bases thereof.

* * * * *